United States Patent [19]

Sugawara

[11] Patent Number: 4,486,718

[45] Date of Patent: Dec. 4, 1984

[54] HIGH GAIN TRANSISTOR AMPLIFIER PRODUCING AN OUTPUT FREE FROM NOISE CARRIED ON THE POWER VOLTAGE

[75] Inventor: Mitsutoshi Sugawara, Tokyo, Japan

[73] Assignee: Nippon Electric Co., Ltd., Tokyo, Japan

[21] Appl. No.: 360,085

[22] Filed: Mar. 19, 1982

[30] Foreign Application Priority Data

Mar. 20, 1981 [JP] Japan ................................. 56-41495

[51] Int. Cl.³ ............................. H03F 1/26; H03F 3/04
[52] U.S. Cl. ..................................... 330/149; 330/290; 330/296; 330/307; 330/310
[58] Field of Search ............... 330/149, 290, 296, 297, 330/307, 312, 311

[56] References Cited

FOREIGN PATENT DOCUMENTS 1816148  6/1970  Fed. Rep. of Germany ...... 330/290
45-17243 6/1970  Japan ................................. 330/310

OTHER PUBLICATIONS

Davidson et al., "Bias Stabilization for Amplifier" *IBM Technical Disclosure Bulletin*, vol. 14, No. 2, Jul. 1971, p. 454.

*Primary Examiner*—James B. Mullins
*Attorney, Agent, or Firm*—Sughrue, Mion, Zinn, Macpeak & Seas

[57] ABSTRACT

The present invention provides an amplifier having cascade-connected first and second transistors, a constant current source for supplying an operating current to the first transistor, and a load resistor connected to the collector of the first transistor at one end and to a substantially constant voltage terminal at the other end. The amplifier arrangement of the invention removes the necessity of a large capacitance capacitor for noise suppression.

9 Claims, 6 Drawing Figures

HIGH GAIN TRANSISTOR AMPLIFIER PRODUCING AN OUTPUT FREE FROM NOISE CARRIED ON THE POWER VOLTAGE

BACKGROUND OF THE INVENTION

The present invention relates to a high-gain transistor amplifier, and more particularly, to a transistor amplifier suited for a semiconductor integrated circuit in which the amplified output is free from noise carried on the power voltage source.

A conventional high-gain transistor amplifier is constructed with at least two cascade-connected transistors. In more detail, an input signal is applied to the base of a first transistor having a collector connected directly to the base of a second transistor and to the power source through a first load resistor. The output is derived from a second load resistor connected to the collector of the second transistor.

In general, the power source produces a DC power voltage from power taken from the commercial electric mains. It is difficult to completely suppress the hum, ripple and other noise present thereon in the output DC power voltage. The hum, ripple and other noise are applied from the power source to the second transistor in the amplifier circuit through the first load resistor and amplified by the second transistor. As a result, amplified hum, ripple and other noise are present on the output of the amplifier, thus producing a low S/N ratio.

For improving the S/N ratio, it has been proposed to divide the first load resistor into first and second parts and to ground the connecting point of the divided load resistor through a large value capacitor. This improvement is effective to improve the S/N ratio. It, however, is accompanied by a difficulty in circuit design.

More specifically, as the load impedance of the first transistor equals the first part of the first load resistor, namely that part of the first load resistor connected between the collector of the first transistor and the large capacitor, the collector current of the first transistor is determined by the total resistance of the divided load resistors. Therefore, the load impedance cannot be made larger than the total resistance required for the collector current of the first transistor. Further, the hum, ripple and other noise cannot be prevented from being applied to the amplifier unless the time constant of the circuit composed of the capacitor and the second part of the first load resistor, namely that part of the first load resistor positioned between the capacitor and the power supply, is made large. However, if the resistance of the second part of the first load resistor is made large, there arises another problem that, since the first part of the first load resistor cannot be made large, the load resistance of the first transistor is compelled to be small to sustain the desired magnitude of collector current. This results in a small voltage gain of the first transistor.

Thus, it is difficult to design the circuit to meet all the requirements regarding the collector current and the load resistance of the first transistor and the time constant for suppressing hum, ripple and other noise.

Recently, transistor amplifiers have been implemented in the form of semiconductor integrated circuits for purposes of cost and size reduction. A prior art amplifier as described above meets another difficulty when it is formed as a semiconductor integrated circuit, specifically, the large value capacitor added in the improved amplifier, which is very expensive in any event, cannot be formed on a semiconductor chip. Consequently, besides those to which the other circuit elements are connected, external terminals (bonding pads) for the capacitor must be provided on the semiconductor chip, thereby resulting in an enlargement of the semiconductor chip, an increased cost, and a low production yield.

Referring to FIG. 1 illustrating a circuit diagram of a prior art high-gain transistor amplifier, an input signal 1 is applied to the base of a transistor 4 via a capacitor 2. The transistor 4, which operates as a common emitter amplifier, has its collector connected to a power source 8 through a load resistor 5 and a filter including a resistor 7 and a capacitor 6. The voltage produced across the load resistor 5 is applied to the base of a transistor 11. The transistor 11, the collector of which is connected to a power source 8 through a load resistor 9, provides an amplified output to an output terminal 10. To operate the transistor 11 in a common emitter mode, the emitter of the transistor 11 is grounded through a capacitor 13 in an AC mode but through a resistor 12 in a DC mode.

The DC voltage produced at the emitter of the transistor 11 is used as a base bias for the transistor 4, being connected thereto through the resistor 3.

This circuit may be formed as a semiconductor integrated circuit by forming transistors 4 and 11, resistors 5, 7, 9 and 12 on a single semiconductor chip. Such an integrated circuit is provided with terminals 10, 24, 25, 26 and 27 for connecting to the chip the external circuit elements including the capacitors 2, 6, 13 and the resistor 3, the power source 8 and input and output circuits.

In this circuit, since the circuit has a negative feedback path for the DC mode, the approximate DC bias voltage at the emitter of the transistor 4 is 0.7 volts, which is equal to the forward-biased base-emitter voltage of the transistor 4. The emitter voltage of the transistor 11 is 0.7 volts since it is substantially equal to the base voltage of the transistor 4. The base voltage of the transistor 11 is 1.4 volts, which is 0.7 volts higher than that of the emitter.

If the circuit were not provided with the capacitor 6, when noise such as hum or ripple is present on the output voltage from the power source 8, the noise would pass through the resistors 7 and 5 and would be amplified by the transistor 11 with the amplified output appearing at the output terminal 10. As a result, a large amount of noise would appear at the output terminal 10. The capacitor 6 is inserted in order to alleviate this problem. By grounding the connection point of the resistors 5 and 7 through the capacitor 6, the noise component from the power source 8 is considerably attenuated at the collector of the transistor 4.

This measure is effective for preventing the noise carried on the power source voltage from reaching the output terminal. It, however, has many problems as mentioned hereinunder.

The collector current of the transistor 4 is given approximately by $$\frac{V8 - 1.4}{R7 + R5},$$

where V8 is the voltage of the power source 8 and R7 and R5 are the resistance values of the resistors 7 and 5. Thus, the collector current of the transistor 4 is determined by the total resistance value of the resistors 5 and 7. On the other hand, the load impedance is determined by the resistance value of the resistor 5 and cannot be made larger than the total resistance value of the resistance 5 and 7. Further, the resistor 7 is required to be large in order to sufficiently reduce the noise component carried on the power source voltage. This is because the amount of reduction of the noise depends on the time constant of the filter formed by the resistor 7 and the capacitor 5.

It is difficult to design the circuit to meet all the requirements relating to the collector current, the load impedance and the time constant of the filter. This difficulty is even more serious in the case where the amplifier is powered with a low power source voltage.

Further, the value of the capacitor 6 is generally chosen to be 10 to 500 µF so that the noise component will be considerably reduced. Such a large capacitor cannot be formed on a semiconductor chip. Thus, if the amplifier is formed as a semiconductor integrated circuit, the capacitor 6 must be externally connected to the integrated circuit. Thus, the integrated circuit requires at least one additional terminal. The provision of this additional terminal lowers the integration density and the production yield.

SUMMARY OF THE INVENTION

The primary object of the present invention is to provide a high-gain transistor amplifier of simple design which provides an output free from noise carried on the power source voltage.

It is another object of the present invention to provide a high-gain transistor amplifier suited for a semiconductor integrated circuit.

According to the present invention, there is provided a high-gain transistor amplifier including a first transistor amplifying an input signal, a second transistor having an input electrode connected to an output electrode of the first transistor, a constant current source supplying an operating current to the first transistor through the output electrode of the first transistor, a constant voltage terminal maintained at a substantially constant voltage, a load connected between the output electrode of the first transistor and the constant voltage terminal, and means for deriving an output from the second transistor.

In the high-gain transistor amplifier of the present invention, there is no noise in the output signal due to noise from the power supply. In more detail, because the output electrode of the first transistor receives an operating current from a constant current source and is connected to a load which is connected to a constant voltage terminal, the noise carried on the power supply voltage is not transferred to the input electrode of the second transistor. Thus, the noise carried on the power supply voltage is not amplified by the second transistor and hence not present in the amplified output.

Further, according to the present invention, while the operating current of the first transistor is determined by the constant current of the constant current source, the load impedance imposed on the first transistor is determined only by the load itself. Since the values of the operating current and the load impedance are freely selectable, the circuit design of the amplifier is very easy. In the circuit of the invention, the voltage at the constant voltage terminal is preferably selected to be the same voltage as the collector bias voltage of the first transistor. This circuit design allows the constant current source and the load to be designed independently, because no bias current flows through the load. It is, however, noted that the invention is not limited to the above-described embodiment. For instance, if the voltage at the constant voltage terminal is made different from the collector bias voltage, some DC bias current flows through the load. Therefore, compensation of the constant current from the constant current source is required. Nevertheless, this does not affect the ease of circuit design for those skilled in the art.

Further, the present invention does not require any large value capacitor in order to eliminate the noise carried on the power supply from the amplified output. Therefore, the transistor amplifier can easily be formed as a semiconductor integrated circuit without added external terminals, thereby decreasing the integration density and the production yield over the prior art.

DESCRIPTION OF THE PREFERRED EMBODIMENTS

Figure 1:
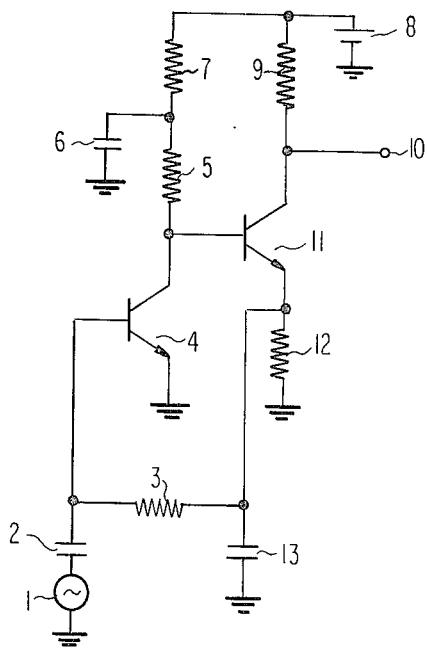
FIG. 1 is a circuit diagram of a high-grain transistor amplifier of the prior art.
Figure 2:
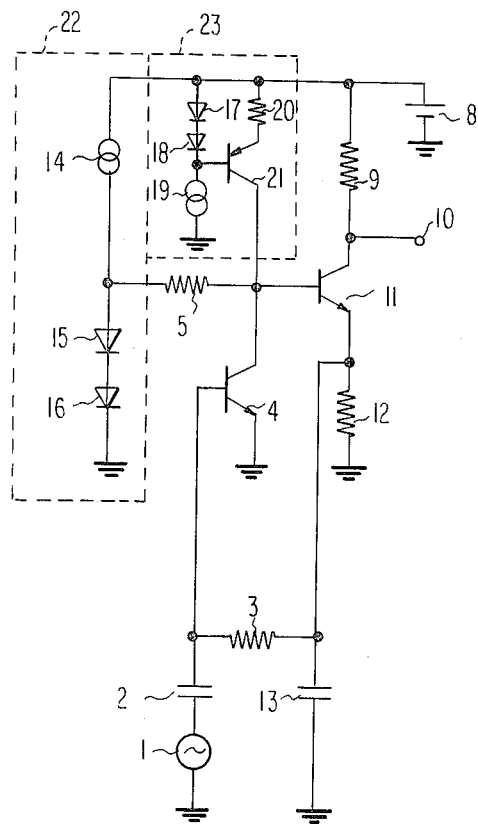
FIG. 2 is a circuit diagram of a first embodiment of an amplifier circuit of the present invention.

Referring now to FIG. 2, a first preferred embodiment of an amplifier circuit of the present invention will be described. In FIG. 2, like numerals designate like elements in FIG. 1 and hence a further description thereof will be omitted except for practical values of various ones of the circuit elements. In an example where 9 volts is used as the power voltage from the power source 8, the resistance values of the resistors 3, 9 and 12 can be selected as 100 kΩ, 22 kΩ and 4.7 kΩ, respectively. The capacitance values of the capacitors 2 and 13 can then be 22 µF and 220 µF, respectively.

A difference of the amplifier circuit of the first embodiment from that of FIG. 1 is the load circuit of the transistor 4. More specifically, the collector of the transistor 4 is here connected to a constant voltage circuit 22 through a load resistor 5 and the transistor 4 receives its operating current from a constant current source 23.

In the constant voltage circuit 22, a constant voltage of about 1.4 volts is produced at the junction point between a current source 14 and a series connection of diodes 15 and 16. The current source 14 supplies a current of 200 µA, as an example, to the series connection of diodes 15 and 16. A load resistor 5 of 22 kΩ, for example, has one end thereof connected to the junction point in the constant voltage source 22 and the other end to the collector of the transistor 4.

The constant current source 23 includes a series connection of a current source 19 and diodes 17 and 18 which is used to produce a voltage of V8-1.4 volts at the junction point between the current source 19 and the diode 18. The junction point is connected to the base of a transistor 21, the emitter of which is connected to the power source 8 through a resistor 20. A constant current of about 0.7/R20 (where R20 is the resistance value of the resistor 20) is provided at the collector of the transistor 21 and is supplied to the collector of the transistor 4. For an example, the current source 19 may be designed to provide a current of 200 μA and the resistor R20 selected to have a resistance value of 3.3 kΩ. A constant current of 200 μA is provided at the collector of transistor 21 in the example given.

It is noted that the respective current sources 14 and 19 may be constructed with only resistors for simplicity.

The output voltage from the constant voltage circuit 22 is fixed at a substantially constant voltage by the forward-biased diodes 15 and 16. As to the constant current source 23, the noise carried on the power source voltage is similarly applied to the base and emitter of the transistor 21. These noise components applied to the base and emitter cancel each other in the transistor 21 to thus provide a noise-free constant current from the collector of the transistor 21. Thus, both the constant current source 23 and the constant voltage source 22 have an output free from the noise carried on the power source voltage. Accordingly, the noise component does not appear at the collector of the transistor 4 and is not present at the collector of the transistor 11. The noise carried on the power source voltage can be effectively suppressed without using any large capacitance value capacitor.

The collector bias voltage of the transistor 4 is held at 1.4 volts due to the feedback operation provided by the resistor 3, as mentioned above in the discussion of the prior art. Thus, the voltages at the two ends of the load resistor 5 are equal to each other so that no bias current flows through the load resistor 5. The collector bias current of the transistor 4 is determined by only the output current from the constant current source 23. Accordingly, the resistance value of the load resistor 5 and the collector current of the transistor 4 can be chosen independently, resulting in an improved ease and flexibility of circuit design.

The amplifier does not require any large capacitance value capacitor, as mentioned above. Accordingly, in the case where the amplifier is formed as a semiconductor integrated circuit, only a small number of elements connected externally to the integrated circuits is required. This also reduces the number of terminals required in the integrated circuit. In comparison with the prior art arrangement of FIG. 1, the terminal 27 is unnecessary. Therefore, the integration density and the production yield of the integrated circuit can be maintained at a higher level.

As another feature, the amount of noise generated by the amplifier itself is very small. The noise from the bias circuit for the base of the transistor 11 is the dominant factor in determining the S/N ratio. According to the first embodiment, the base bias voltage of the transistor 11 is applied by the constant voltage circuit 22. In this constant voltage circuit 22, the constant voltage is generated by the forward-biased diodes 15 and 16. The noise voltage generated by a forward-biased diode is given by $2kTr_e\Delta f$, where k is Boltzmann's constant, T the absolute temperature, $r_e$ the dynamic resistance of the diode, and $\Delta f$ the frequency bandwidth. The noise generated by a pure resistance element is given by $4kTR\Delta f$, where R is the resistance of the pure resistance element. Thus, it may be seen that the noise generated by the constant voltage circuit 22 is very small compared to a constant voltage circuit formed by pure resistance elements. Further, it is possible to use a zener diode in place of the diodes 15 and 16. However, a large amount of noise, such as 100 μV r.m.s., is generated by a zener diode due to the fact that the breakdown voltage is not even over the entire PN junction in a zener diode. On the other hand, the total amount of noise generated by the instant voltage source 22 and the constant current source 23 of the circuit of the invention using forward biased diodes is only about 1.3 μV r.m.s. Thus, it is preferable to use forward-biased diodes rather than a zener diode.

Similarly, since the constant voltage elements in the constant current source 23 are the forward-biased diodes 17 and 18, the amount of noise produced by the constant current source 23 and applied to the base of the transistor 11 is very small.

Figure 3:
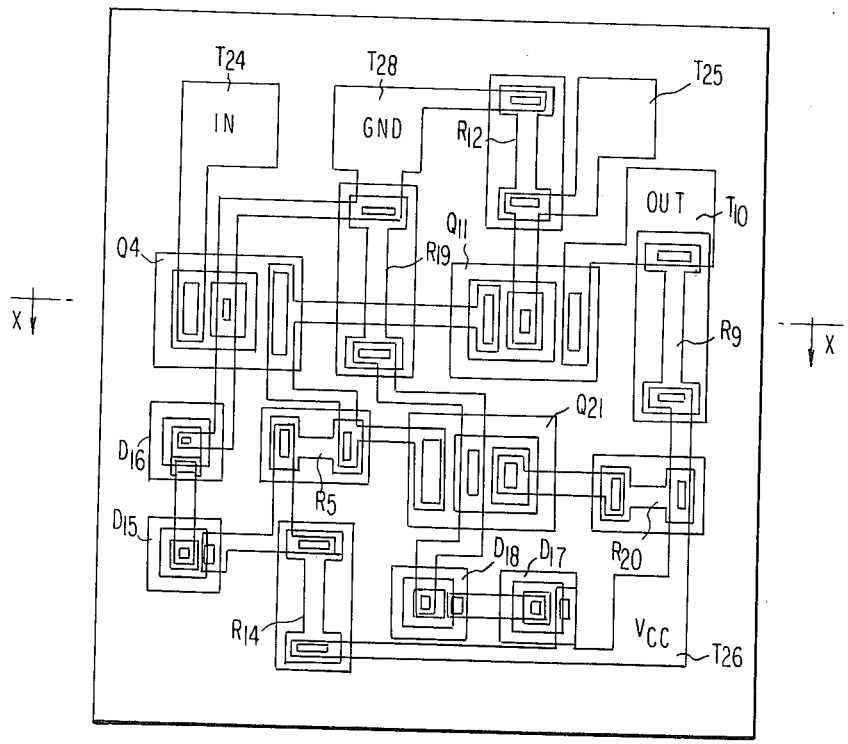
FIG. 3 is a plan view of a semiconductor integrated circuit incorporating therein the high-gain transistor amplifier of the first embodiment.
Figure 4:
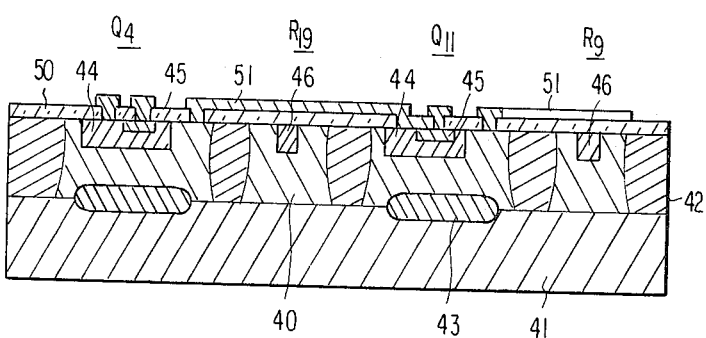
FIG. 4 is a sectional view taken along a line X—X in FIG. 3.
Figure 5:
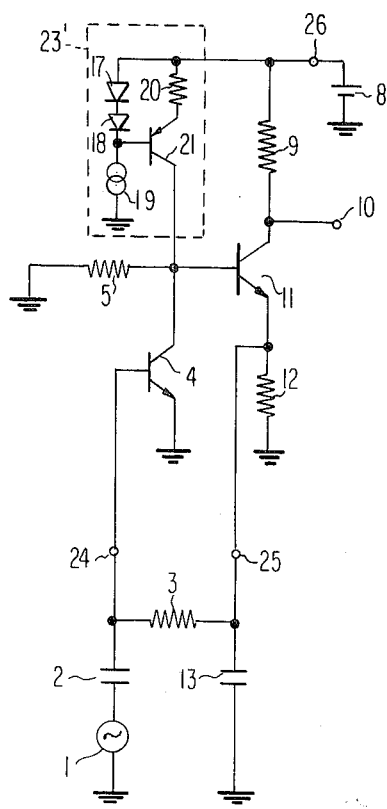
FIG. 5 is a circuit diagram of a second embodiment of the present invention.

An example of a semiconductor integrated circuit incorporating a transistor amplifier as shown in FIG. 2 is illustrated in FIGS. 3 and 4, of which FIG. 4 is a plan view of the integrated circuit chip and FIG. 5 is a sectional view taken along line X—X of FIG. 3.

On a P-type silicon substrate 41 an N-type silicon epitaxial layer 40 is grown. The epitaxial layer 40 is divided into a plurality of isolated island regions by P-type isolation regions 42. Elements such as transistors and resistors are formed within the island regions. The island regions in which transistors $Q_4$, $Q_{11}$ and $Q_{21}$ are formed have P-type buried regions 43 at their bottom. The transistors $Q_4$, $Q_{11}$ and $Q_{21}$, corresponding to the transistors 4, 11 and 21 of FIG. 2, are formed by diffusing a P-type impurity into the island regions to form base regions 44 and then diffusing an N-type impurity into the base regions 44 to form emitter regions 45. The diodes $D_{15}$, $D_{16}$, $D_{17}$ and $D_{18}$, corresponding to the diodes 15, 16, 17 and 18 in FIG. 2, are similarly formed by double impurity diffusion. The resistors $R_5$, $R_9$, $R_{12}$ and $R_{20}$, corresponding to the resistors 5, 9, 12 and 20 in FIG. 2, are formed by diffusing a P-type impurity into island regions to form P-type regions 46. The current sources 14 and 19 of FIG. 2 are formed by resistors $R_{14}$ and $R_{19}$. On the surface of the epitaxial layer 40 an insulator film 50 having holes through which interconnections are made is deposited. An aluminum interconnection layer 51 is formed on the insulator film 50. This interconnection layer 51 has terminal pads $T_{10}$, $T_{24}$, $T_{25}$, $T_{26}$ and $T_{28}$ corresponding to the terminals 10, 24, 25, 26 and 28.

In this example, the transistors having bases and collectors connected together are used as diodes. These diode-connected transistors have the same characteristics as a discrete diode device.

FIG. 5 is a schematic diagram of the second embodiment of an amplifier circuit the present invention. One end of the load resistor 5, having a value of 22 kΩ, is grounded. Accordingly, a DC current of 60 μA flows through the load resistor 5. The constant current source 23' is designed to provide a constant current of 260 μA, which is the sum of the collector bias current (200 μA) of the transistor 4 and the current (60 μA) flowing through the resistor 5. Accordingly, the resistance value of the resistor 20' is selected to be 2.7 kΩ. The remainder of the circuit is the same as the first embodiment.

The second embodiment does not require the constant voltage circuit 22 of FIG. 2. The same advantageous features and effects achieved with the first embodiment are obtained in the second embodiment by the arrangement of the constant current source 23 and the appropriate setting of the magnitude of the output current.

Figure 6:
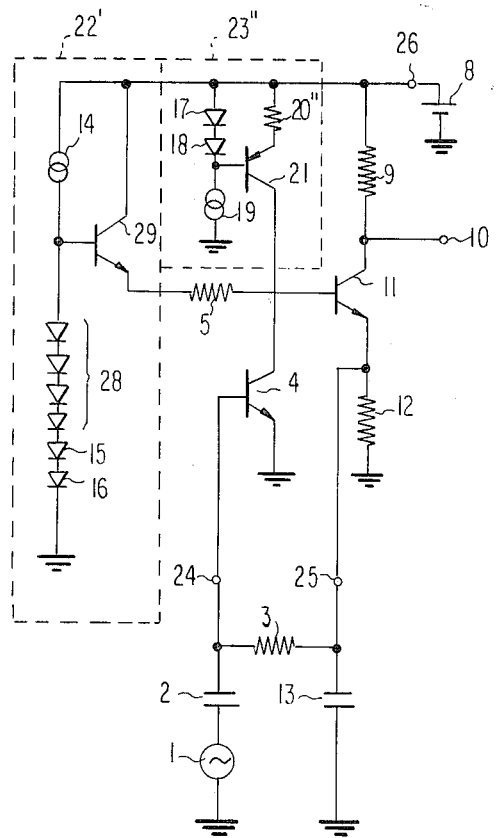
FIG. 6 is a circuit diagram of a third embodiment of the present invention.

FIG. 6 is a schematic diagram of a third embodiment of the present invention in which only the constant voltage circuit 22' and the constant current source 23" are changed from the first embodiment shown in FIG. 2. The constant voltage circuit 22' here includes an additional diode chain 28 and an emitter-follower transistor 29. The additional diode chain 28 has, for example, four forward-biased diodes connected in series. A substantially constant voltage of 4.2 volts, which is obtained at the junction point between the current source 14 and the diode chain 28, is applied to the base of the emitter-follower transistor 29, the collector of which is connected to the power source 8. The emitter of the transistor 29 is connected to the load resistor 5, the resistance value of which is 22 kΩ.

In this third embodiment, a DC current of about 100 μA flows through the load resistor 5 and into the collector of the transistor 4. Accordingly, the output current from the constant current source 23" must be set to provide a current of 200 μA to the collector of the transistor 4. To achieve this, the resistance value of the resistor 20" in the constant current source 23" is determined as 6.8 kΩ to thereby provide a current of 100 μA from the collector of the transistor 21.

In accordance with this third embodiment, a small part of the current flowing through the current source 14 flows into the base of the transistor 29. This causes a small change in the current flowing through the diode chain 28 and the diodes 15 and 16, even if a larger change in current flowing through the collector of the transistor 4 occurs due to the presence of a large input signal. Therefore, the change in voltage at the junction point between the current source 14 and the diode chain is very small in spite of the large input signal. As a result, the S/N ratio of the output amplified signal is further improved.

As to the noise produced by the constant voltage circuit 22', since the noise from the emitter-follower transistor 29 may be considered to be the same as the noise from a forward-biased diode, the increment in the noise level is small.

As is apparent from the first, second and third embodiments, the present invention is not limited to an arrrangement in which the constant voltage circuit generates a voltage equal to the collector bias voltage of the transistor 4. Even in a case where the voltage generated by the constant voltage circuit is different from the collector bias voltage of the transistor 4, a similar advantage may be obtained by the arrangement of the constant current source 23.

Further, it is apparent to the skilled in the art that the transistor 4 and/or 11 of each of the described embodiments may be replaced by a compound transistor which combines two or more transistors as a single equivalent transistor. Still further, the input signal may be directly applied to the base of the transistor 4 by use of an emitter-follower transistor. In this arrangement, the capacitor 2 may be eliminated.

I claim:

1. A transistor amplifier comprising:
   a power supply terminal for receiving a power source voltage;
   a reference potential terminal for receiving a fixed reference potential.
   an input terminal for receiving an input signal;
   a first transistor having an emitter coupled to said reference potential terminal, a base coupled to said input terminal, and a collector;
   a first constant current source connected between said collector of said first transistor and said power supply terminal, said first constant current source supplying an operating current to said first transistor;
   a first load having one end connected to said collector of said first transistor;
   a second constant current source connected between the other end of said first load and said power supply terminal;
   a series circuit of a predetermined number of forward biased diodes, said series circuit being connected between said other end of said first load and said reference potential terminal;
   a second transistor having a base coupled to said collector of said first transistor, an emitter coupled to said reference potential terminal through a first resistor, and a collector;
   an output terminal coupled to said collector of said second transistor;
   a second load connected between said collector of said second transistor and said power supply terminal; and
   a D.C. feedback means for feeding back the signal at said emitter of said second transistor to said base of said first transistor.

2. A transistor amplifier as claimed in claim 1, wherein said predetermined number of forward biased diodes is two.

3. A transistor amplifier as claimed in claim 1, wherein said predetermined number of forward biased diodes is more than two.

4. A high-gain transistor amplifier comprising:
   an input terminal for receiving an input signal;
   a reference voltage terminal;
   a power source terminal for receiving a power supply voltage;
   a first transistor for amplifying said input signal, said first transistor having a common electrode coupled to said reference voltage terminal, an input electrode coupled to said input terminal and an output electrode;
   a second transistor having an input electrode connected to said output electrode of said first transistor, a common electrode and an output electrode;
   a constant current source inserted between said power source terminal and said output electrode of said first transistor, said constant current source supplying an operating current to said first transistor;
   a constant voltage source coupled to said power source terminal and having a constant voltage terminal maintained at substantially the same voltage as the voltage at said output electrode of said first transistor;
   a load connected between said output electrode of said first transistor and said constant voltage terminal; and
   means for providing an output signal from said second transistor.

5. A high-gain transistor amplifier comprising:
   an input terminal for receiving an input signal;
   a reference voltage terminal;
   a power source terminal for receiving a power supply voltage;
   a first transistor for amplifying said input signal, said first transistor having a common electrode coupled to said reference voltage terminal, an input electrode coupled to said input terminal and an output electrode;

a second transistor having an input electrode connected to said output electrode of said first transistor, a common electrode and an output electrode;

a constant current source inserted between said power source terminal and said output electrode of said first transistor, said constant current source supplying an operating current to said first transistor;

a constant voltage source coupled to said power source terminal and having a constant voltage terminal maintained at a substantially constant voltage;

a load connected between said output electrode of said first transistor and said constant voltage terminal;

means for providing an output signal from said second transistor; and feedback means for feeding a DC voltage at a common electrode of said second transistor to an input electrode of said first transistor.

6. A high-gain transistor amplifier comprising:

an input terminal for receiving an input signal;

a reference voltage terminal;

a power source terminal for receiving a power supply voltage;

a first transistor for amplifying said input signal, said first transistor having a common electrode coupled to said reference voltage terminal, an input electrode coupled to said input terminal and an output electrode;

a second transistor having an input electrode connected to said output electrode of said first transistor, a common electrode and an output electrode;

a constant current source inserted between said power source terminal and said output electrode of said first transistor, said constant current source supplying an operating current to said first transistor;

a constant voltage generator for supplying a substantially constant voltage to a constant voltage terminal, said constant voltage generator including at least two forward-biased diodes connected in series;

a load connected between said output electrode of said first transistor and said constant voltage terminal; and means for providing an output signal from said second transistor.

7. A high-gain transistor amplifier comprising:

an input terminal for receiving an input signal;

a reference voltage terminal;

a power source terminal for receiving a power supply voltage;

a first transistor for amplifying said input signal, said first transistor having a common electrode coupled to said reference voltage terminal, an input electrode coupled to said input terminal and an output electrode;

a second transistor having an input electrode connected to said output electrode of said first transistor, a common electrode and an output electrode;

a constant current source inserted between said power source terminal and said output electrode of said first transistor, said constant current source supplying an operating current to said first transistor;

a constant voltage generator for supplying a substantially constant voltage to a constant voltage terminal, said constant voltage generator including more than three forward-biased diodes connected in series and a third transistor having an emitter connected to said constant voltage terminal, a voltage obtained from said series connection of said forward-biased diodes being applied to a base of said third transistor, a load connected between said output electrode of said first transistor and said constant voltage terminal; and means for providing an output signal from said second transistor.

8. A high-gain amplifier comprising: an input terminal; an output terminal; a power supply line; a reference potential terminal; a first amplifying section having a first input connected to said input terminal, a first output, and a first load having one end connected to said first output; a second amplifying section having a second input connected to said first output, a second output, and a second load inserted between said second output and said power supply line; a constant current source inserted between said first output and said power supply; and means for applying a substantially constant voltage to the other end of said first load, said applying means including an emitter-follower transistor having an emitter connected to said other end of said first load.

9. A high-gain amplifier comprising: an input terminal; an output terminal; a power supply line; a reference potential terminal; a first amplifying section having a first input connected to said input terminal, a first output, and a first load having one end connected to said first output; a second amplifying section having a second input connected to said first output, a second output, and a second load inserted between said second output and said power supply line; a constant current source inserted between said first output and said power supply; means for applying a substantially constant voltage to the other end of said first load; and feedback means for supplying a DC voltage from said second amplifying section to said first input of said first amplifying section.

* * * * *

UNITED STATES PATENT AND TRADEMARK OFFICE
CERTIFICATE OF CORRECTION

PATENT NO. : 4,486,718

DATED : December 4, 1984

INVENTOR(S) : Mitsutoshi Sugawara

It is certified that error appears in the above-identified patent and that said Letters Patent is hereby corrected as shown below:

Column 3, line 7, change "5" to --6--.

Column 7, line 49, change "the" before "skilled" to --one--.

Column 7, line 62, change "." to --;--.

Signed and Sealed this

First Day of October 1985

[SEAL]

Attest:

DONALD J. QUIGG

Attesting Officer

Commissioner of Patents and Trademarks—Designate